(12) United States Patent
Cuony et al.

(10) Patent No.: US 9,337,367 B2
(45) Date of Patent: May 10, 2016

(54) MULTIPLE-JUNCTION PHOTOELECTRIC DEVICE AND ITS PRODUCTION PROCESS

(75) Inventors: Peter Cuony, Neuchatel (CH); Matthieu Despeisse, Neuchatel (CH); Christophe Ballif, Neuchatel (CH); Gaetano Parascandolo, Prilly (CH)

(73) Assignee: ECOLE POLYTECHNIQUE FEDERALE DE LAUSANNE, Lausanne (CH)

( * ) Notice: Subject to any disclaimer, the term of this patent is extended or adjusted under 35 U.S.C. 154(b) by 425 days.

(21) Appl. No.: 13/813,043

(22) PCT Filed: Jun. 23, 2011

(86) PCT No.: PCT/EP2011/060536
§ 371 (c)(1),
(2), (4) Date: Feb. 25, 2013

(87) PCT Pub. No.: WO2012/013428
PCT Pub. Date: Feb. 2, 2012

(65) Prior Publication Data
US 2013/0146131 A1    Jun. 13, 2013

(30) Foreign Application Priority Data
Jul. 29, 2010    (EP) .................................... 10171263

(51) Int. Cl.
*H01L 31/0224*    (2006.01)
*H01L 31/0236*    (2006.01)
(Continued)

(52) U.S. Cl.
CPC ...... *H01L 31/02363* (2013.01); *H01L 31/0236* (2013.01); *H01L 31/03687* (2013.01);
(Continued)

(58) Field of Classification Search
CPC .............. H01L 31/0236; H01L 31/076; H01L 31/1824; H01L 31/03687; H01L 31/02363; H01L 31/1816

USPC .......................................................... 136/256
See application file for complete search history.

(56) References Cited

U.S. PATENT DOCUMENTS

2002/0008192 A1    1/2002    Isomura
2003/0010900 A1    1/2003    Tawada et al.
(Continued)

FOREIGN PATENT DOCUMENTS

CH    WO 2007/113037    * 10/2007
JP    58 122783 A    7/1983
(Continued)

OTHER PUBLICATIONS

Hirata G A et al.: "The Role of an Amorphous SiC:H Buffer in the High-Performance UC-SiC:H/A-SiC:H/ Poly-Si Heterojunction Solar Cells", IEEE Electron Device Letters, IEEE Service Center, New York, NY, US, vol. 12, No. 10, Oct. 1, 1991, pp. 562-564, XPOO0226023, ISSN: 0741-3106, 001: 001:10.1109/55.119189 the whole document.
(Continued)

*Primary Examiner* — Jayne Mershon
(74) *Attorney, Agent, or Firm* — Young & Thompson (57) ABSTRACT

A multiple-junction photoelectric device includes sequentially, a substrate, a first conducting layer, at least two elementary photoelectric devices, at least one of the elementary photoelectric devices being made of microcrystalline silicon, and a second conducting layer. The first conducting layer has a surface facing the microcrystalline silicon elementary photoelectric device such that the surface:
has a lateral feature size bigger than 100 nm, and a root-element-square roughness bigger than 40 nm,
includes inclined elementary surfaces such that $\alpha_{50}$ is greater than 20°, where $\alpha_{50}$ is the angle for which 50% of the elementary surfaces of the surface of the first conducting layer have an inclination equal to or less than this angle, and
includes valleys formed between two elementary surfaces and having a radius of curvature smaller than 100 nm.

20 Claims, 8 Drawing Sheets

(51) Int. Cl.
*H01L 31/0368* (2006.01)
*H01L 31/076* (2012.01)
*H01L 31/18* (2006.01)

(52) U.S. Cl.
CPC .......... *H01L31/076* (2013.01); *H01L 31/1816* (2013.01); *H01L 31/1824* (2013.01); *Y02E 10/548* (2013.01)

(56) References Cited

U.S. PATENT DOCUMENTS

| | | | | |
|---|---|---|---|---|
| 2007/0209699 | A1* | 9/2007 | Sichanugrist | H01L 31/0745 136/261 |
| 2010/0126575 | A1* | 5/2010 | Bailat | H01L 31/022466 136/256 |
| 2010/0126579 | A1* | 5/2010 | Fang | H01L 31/075 136/256 |
| 2010/0307557 | A1* | 12/2010 | Yamazaki | B60T 1/10 136/244 |
| 2011/0126895 | A1* | 6/2011 | Uda | H01L 31/03921 136/255 |

FOREIGN PATENT DOCUMENTS

| | | | |
|---|---|---|---|
| JP | 2003-179241 | * | 6/2003 |
| JP | WO 2010/052981 | * | 5/2010 |

OTHER PUBLICATIONS

Ogawa S et al: "Heterojunction amorphous silicon solar cells with n-type microcrystalline cubic silicon carbide as a window layer", Japanese Journal of Applied Physics. Japan Society of Applied Physics. JP. vo 1. 46. No. 2. Feb. 1, 2007. pp. 518-522. XP001517893, ISSN: 0021-4922. DOI: DOI:10.1143/JJAP.46.518 the whole document.

European Search Report, dated Feb. 17, 2011, from corresponding European application.

International Search Report, dated Mar. 26, 2012, from corresponding PCT application.

* cited by examiner

MULTIPLE-JUNCTION PHOTOELECTRIC DEVICE AND ITS PRODUCTION PROCESS

TECHNICAL FIELD

The present invention relates to the field of solar cells. More particularly, it relates to a multiple-junction photoelectric device comprising in sequence a substrate, a first conducting layer, a stack of amorphous silicon or silicon alloys elementary photoelectric devices (absorbing blue to red light, possibly infrared with SiGe alloys) and microcrystalline elementary photoelectric devices (absorbing red to infrared), and a second conducting layer. The invention also relates to a method for producing this multiple-junction device.

A particularly advantageous application of the present invention is for the production of photovoltaic cells intended for generating electrical energy, but the invention also applies, more generally, to any structure in which an incoming radiation is converted into an electrical signal, such as photodetectors and ionizing radiation detectors.

BACKGROUND OF THE INVENTION

Thin film silicon solar cells can be produced in superstrate (pin) and substrate (nip) configurations, with structures consisting of stacked cells in pin-pin or nip-nip configurations with two or more than two stacked cells to produce multi-junctions solar cells. The thin film silicon cells are hydrogenated amorphous silicon (a-Si:H) and hydrogenated microcrystalline silicon ($\mu$c-Si:H) cells, which can thus be used in stacked conjunction in order to optimize the use of the full solar spectrum, allowing for improved efficiencies. The development of high-efficiency thin-film silicon solar cells in the different configurations then requires a cell design allowing for a high light trapping while maintaining optimum cell electrical properties. An improved light management in the cells is decisive in order to lead to increased effective light paths in the absorbing film and thus to the possible use of thinner photo-active layers in the cells. While this is important for production throughput and cost reduction, improved light trapping and the use of thin intrinsic layers are mandatory to achieve higher conversion efficiencies because of inherent material properties. For hydrogenated amorphous silicon (a-Si:H), the impact onto the cell performance of the light induced degradation of the bulk material (Staebler-Wronski effect) can be reduced in thinner films. In the case of microcrystalline silicon ($\mu$c-Si:H), light trapping is mandatory to compensate the low absorption due to the indirect band-gap, so as to allow for the use of $\mu$c-Si:H layers with thicknesses not impacting the cell electrical properties.

Light trapping is obtained by introducing a textured interface, either by having a glass substrate coated with transparent and nanotextured materials or by coating an opaque substrate with a rough structure. The light is scattered at the rough interfaces, in transmission and/or in reflection at the textured interfaces of the structure. This scattering can increase the effective path length of each photon through the absorber layer (if the light diffusion takes place at high angles) and can lead to multiple internal reflections in the devices. These two combined effects lead to light trapping in the solar cell and can multiply the optical thickness of the absorber layer without requiring an increase in the physical thickness of the photo-active layer. Typical values for the light path enhancement of 5 to 20 are reported in the literature. The typical lateral feature size (D) and root-mean-square (rms) roughness (Rrms) of the features required for light trapping in a-Si:H cells are in the range of D=100-300 nm and Rrms 50-200 nm, and for the $\mu$c-Si:H and multi-junction cells incorporating a $\mu$c-Si:H junction in the range of D=200-2000 nm and Rrms=50-500 nm.

Several textured surfaces of either the substrate or of the transparent conductive oxide (TCO) layer that precede the silicon deposition were developed demonstrating enhanced light management and therefore increased short circuit current densities in both a-Si:H and $\mu$c-Si:H based thin film silicon solar cells. Textured $SnO_2$ deposited by APCVD, sputtered-etched ZnO, low pressure chemical vapor deposition (LPCVD) ZnO are such demonstrated solutions. For instance, LPCVD ZnO films are polycrystalline films constituted of large grains, with a surface characterized by large pyramidal features, which provide to LPCVD as-grown ZnO good light scattering ability. The pyramidal features characteristics of the layers can be varied by a control of the growth conditions and by variations of the layer thickness, resulting in a control over which wavelengths are preferentially scattered.

In all generality though, there is strong drawback of most light scattering schemes.

A strong problem that occurs in the realization of devices is that when rough structures are introduced to realize an efficient light scattering, they also tend to create in-homogeneities and defects in the absorber layers of the solar cell, resulting in possible local current drains such as low-quality diodes or physical shunts. This effect was shown to be universal and applies for all rough (rms>50 nm) superstrates and susbtrates electrodes presenting "sharp" features in the sense of valley with short radius of curvature (typically smaller than 100 nm) or facets with inclinations higher than 20°. This is particularly true for the $\mu$c-Si:H cell which is particularly affected by the substrate morphology.

In particular, $\mu$c-Si:H solar cells deposited on rough LPCVD ZnO, or rough $SnO_2$, or rough pyramidal structures, suffer from losses in $V_{OC}$ and FF, caused by the local low-quality materials formation resulting from the rough substrate morphology. As almost always, for instance when increasing the roughness of the ZnO, the short circuit current ($J_{SC}$) of cells increases, but the efficiency is not maximized due to the losses in $V_{OC}$ and FF. Conversely, $\mu$c-Si:H cells prepared on flat substrates show very high $V_{OC}$ and FF, but suffer from sub-optimal $J_{SC}$. This is also true for solar cells prepared on opaque back-reflector.

This effect, which is detrimental for microcrystalline silicon cell, was demonstrated to have a strong impact in multi-junction solar cells. After the growth of the amorphous silicon top cells, cracks continue to propagate or even start to grow in the microcrystalline silicon layer. Hence, it is particularly true for multi-junctions devices that the growth of the a-Si:H cell, possibly of the intermediate reflector and of the recombination junction can lead to a surface morphology even more prone to induce cracks and low quality material regions in the growth of the subsequent microcrystalline silicon cell. This leads to strong reduction of $V_{OC}$ and FF. Indeed many solar cell production lines worldwide are fighting with this effect. Hence it is of critical importance to avoid the detrimental effects of such cracks in the multi-junctions cell.

A first approach to accommodate for the local low-quality materials regions acting as local current drains is therefore to reduce their density in the solar cell. This has to be done while not impacting too strongly the substrate morphology in order to conserve a good light trapping. This can be realized to some extent via optimizations of the deposition process in order to have a bulk material growth more adapted to sharp surface features. Another solution is to modify the textured surface morphology in order to smooth the sharp valleys while maintaining the peak textures. This can be realized for cells incorporating textured LPCVD ZnO by applying a post-plasma treatment that will smooth the surface. If the radius of curvature at the bottom of the valley is reduced, the $V_{OC}$ and FF are increased thanks to a reduction of the density of the local low-quality material regions. A drawback of such solution is however that the texture is modified; therefore lowering the light trapping potential and decreasing short circuit current density. Finally and in more general terms, the use of textured substrates with a reduced roughness also allows for a decreased density of local current drains, the amorphous silicon top cell can even tend to slightly smoothen out the initial surface if the surface texture dimensions are lower to that of the cell. However, a less pronounced texture will here again lead to a reduced light trapping potential. The optimum textured surface has therefore to lead to an optimum tradeoff between light trapping ability (short circuit current) and density of low-quality material regions and local current drains ($V_{OC}$ and FF). Such optimum texture is difficult to achieve and none of the actual developed solutions have permitted such breakthrough.

In conclusion, a controlled growth of a high material quality can first result in improved performance of μc-Si:H cells onto textured substrates. However, while it does not show to be sufficient for highly textured substrates which have higher light trapping potential, this optimization of the deposition process require precise deposition conditions, therefore rendering the cell properties and reliability sensitive to drift in deposition process and to non-uniformities in the reactor, strongly impacting yield and robustness of the cell design. Finally, the reduction of the density of locally low quality diodes can be realized with proper optimization of the structured interface, but always at the price of reduced light trapping potential.

SUMMARY OF THE INVENTION

The present invention provides a multiple-junction photoelectric device which allows to alleviate the disadvantages of the prior art.

Accordingly, the present invention relates to a multiple-junction photoelectric device comprising in sequence a substrate, a first conducting layer, at least two elementary photoelectric devices, at least one of said elementary photoelectric devices being made of microcrystalline silicon, and a second conducting layer. The first conducting layer has a surface facing said microcrystalline silicon elementary photoelectric device such that:
  said surface has a lateral feature size (D) bigger than 100 nm, preferably bigger than 200 nm, and smaller than 1500 nm and a root-means-square roughness (Rrms) bigger than 40 nm, preferably bigger than 60 nm and even more preferably bigger than 100 nm, and smaller than 500 nm,
  said surface comprises inclined elementary surfaces such that α50 is greater than 20°, where α50 is the angle for which 50% of the elementary surfaces of the surface of the first conducting layer have an inclination equal to or less than this angle, and
  said surface comprises valleys being formed between two elementary surfaces and having a radius of curvature smaller than 100 nm.

Moreover, said microcrystalline silicon elementary photoelectric device comprises, on the incoming light side, a p-type layer being made of at least one silicon alloy $SiM_x$ where M is O, C, N, and x>0.1, said p-type layer containing silicon grains.

Preferably, the other elementary photoelectric device may be based on amorphous silicon.

In a nip-nip configuration, the first conducting layer is a back electrode layer deposited on the substrate, the microcrystalline silicon elementary photoelectric device being deposited on the first conducting layer and having a n-i-p configuration, and the second conducting layer is a top electrode layer. The other elementary photoelectric device deposited between the microcrystalline silicon elementary photoelectric device and the top electrode layer is based on amorphous silicon and has a n-i-p configuration.

In a pin-pin configuration, the substrate is transparent, the first conducting layer is a top electrode layer being deposited on said substrate, the second conducting layer is a back electrode layer, and the microcrystalline silicon elementary photoelectric device has a p-i-n configuration. The other elementary photoelectric device is deposited between the first conductive layer and the microcrystalline silicon elementary photoelectric device, and is based on amorphous silicon with a p-i-n configuration.

The present invention relates also to a method for producing a multi-junction photoelectric device as defined above and comprising the following steps of:
  providing a substrate on which a first conducting layer has been deposited, the first conducting layer having, opposite to the substrate, a surface such that:
    said surface has a lateral feature size (D) bigger than 100 nm, preferably bigger than 200 nm, and smaller than 1500 nm and a root-means-square roughness (Rrms) bigger than 40 nm, preferably bigger than 60 nm and even more preferably bigger than 100 nm, and smaller than 500 nm,
    said surface comprises inclined elementary surfaces such that α50 is greater than 20°, where α50 is the angle for which 50% of the elementary surfaces of the surface of the first conducting layer have an inclination equal to or less than this angle, and
    said surface comprises valleys being formed between two elementary surfaces and having a radius of curvature smaller than 100 nm,
  depositing at least two elementary photoelectric devices, at least one of said elementary photoelectric devices being made of microcrystalline silicon, said microcrystalline silicon elementary photoelectric device comprising, on the incoming light side, a p-type layer being made of at least one silicon alloy $SiMX$ where M is O, C, N, and x>0.1, said p-type layer containing silicon grains, and
  depositing a second conducting layer.

Preferably, the other elementary photoelectric device is based on amorphous silicon.

DETAILED DESCRIPTION

In the present description, the term "back electrode layer" means the electrode layer which is the farthest away from the incoming light side. It is usually associated with a back-reflector effect, to reflect the light in the cell. The term "top electrode layer" means the electrode layer or the electrode system layers which is the closest to the incoming light side.

In the present description, the term "microcrystalline silicone" means a mixed phase material containing silicon nanocrystals and amorphous tissue.

Figure 1:
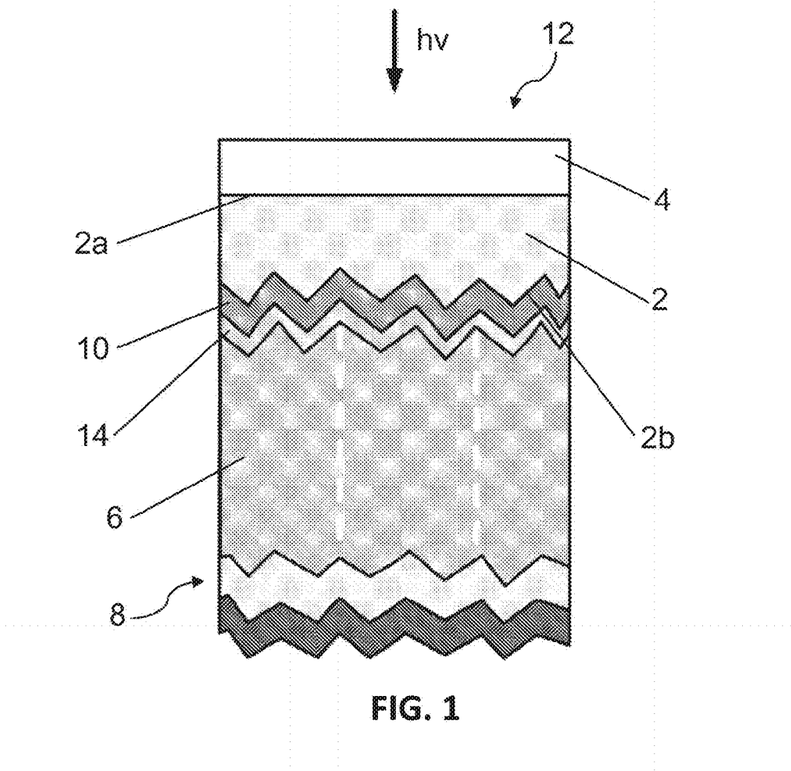
FIG. 1 is a schematic cross-section view of a a-Si:H/μc-Si:H double-junction solar cell in pin-pin configuration, according to the invention.

In reference to FIG. 1, a α-Si:H/μc-Si:H double-junction (micromorph) solar cell 12 is shown, representing one amongst different possible multi-junction configurations.

The cell 12 comprises in sequence a first conducting layer 2, corresponding to the top electrode layer, deposited on a substrate 4, an amorphous silicon elementary photoelectric top device 10, an intermediate layer 14, a microcrystalline silicon elementary photoelectric bottom device 6, and a second conducting layer 8, corresponding to the back electrode layer.

The substrate 4 may be made of a material chosen from the group comprising glass and plastics (for example PEN, PET and polyimide). The top electrode 2 is made of a transparent conducting oxide (for example ZnO, ITO or SnO$_2$). Said top electrode 2 has, on the incoming light side, a top face 2a and, on the other side, a bottom face 2b.

The back electrode layer 8 is made of a transparent conducting oxide (for example ZnO, ITO, InO, SnO$_2$, etc.), a metal (Ag, Al) or the combination of a transparent oxide and a metal. The top and back electrode layers 2 and 8 are deposited by processes known to those skilled in the art, such as evaporation, sputtering, and chemical deposition. For the top electrode layer 2, it is preferred to use the chemical deposition process (examples: LP-CVD ZnO, AP-CVD SnO$_2$).

The intermediate layer 14 can be deposited between the amorphous silicon top device 10 and the microcrystalline silicon bottom device 6. The intermediate layer 14 consists of a layer of a material chosen from the group comprising zinc oxide, doped silicon oxides, doped porous silicon oxides, tin oxide, indium oxide, doped silicon carbide, doped amorphous silicon, doped microcrystalline silicon and combinations thereof. Preferably, doped silicon oxide is used.

Preferably, the intermediate layer 14 has a thickness of between 10 nm and 500 nm, more preferably between 50 nm and 150 nm.

Alternatively, instead of one a-Si top cell, several amorphous silicon or silicon alloys can be used to form a multi-junction device.

The photoelectric devices 6 and 10 may have a p-i-n or p-n configuration.

The amorphous photoelectric device 10, is based on amorphous silicon or on a silicon compound (for example SiC, SiO, SiGe, etc.). It has a thickness of between 20 and 800 nm, preferably between 100 nm and 250 nm. As such amorphous elementary photoelectric device is well known from one skilled in the art, no further description is needed.

According to the invention, the bottom face 2b of the top electrode 2, which corresponds to the surface of the first conducting layer facing the microcrystalline silicon photoelectric device 6 is such that:

said surface 2b has a lateral feature size (D) bigger than 100 nm, preferably bigger than 200 nm, and smaller than 1500 nm and a root-means-square roughness (Rrms) bigger than 40 nm, preferably bigger than 60 nm and even more preferably bigger than 100 nm, and smaller than 500 nm, said surface 2b comprises inclined elementary surfaces such that α50 is greater than 20°, where α50 is the angle for which 50% of the elementary surfaces of the surface of the first conducting layer 2 have an inclination equal to or less than this angle, and said surface 2b comprises valleys being formed between two elementary surfaces and having a radius of curvature smaller than 100 nm.

Figure 2:
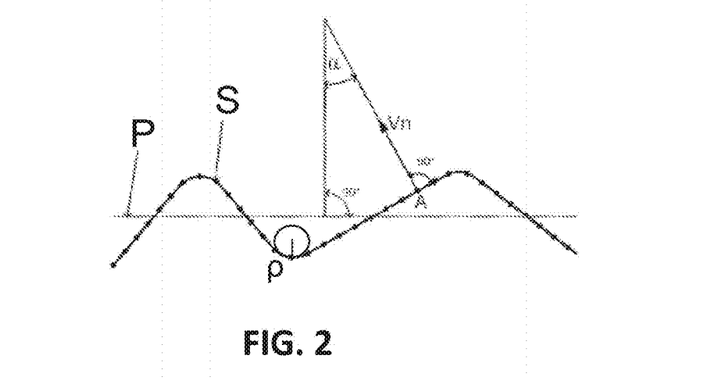
FIG. 2 shows a diagram illustrating the calculation of the angle of inclination of the surface at the point A of an atomic force microscopy (AFM) image.

Referring to FIG. 2, the morphology of the surface is described here by the inclinations of the elementary surfaces making up the rough surface of the specimen, also called the angular distribution of the surface. To do this, an AFM measurement is carried out on a surface measuring 5 μm×5 μm corresponding to a matrix of 256×256 equidistant points (x and y axes in the conventional coordinate system) which represents the topology (z axis) of the surface of the specimen. To remove any inclination or curvature of the substrate, the 2nd-order polynomial that minimizes the sum of the squared differences between itself and the surface is subtracted from this image. What is thus obtained is a good representation of the morphology of the surface S, which typically consists of structures having sizes between 50 and 2000 nm. The plane z=0 is defined as being the horizontal plane P.

To obtain the angular distribution of the surfaces, the angle between the vector normal to the horizontal plane P and the vector Vn normal to the surface S is calculated for each point A in the AFM image. To do this, the relevant elementary surface for calculating the normal to the point A is defined by the point A and two vectors Vx and Vy. Vx is the vector that connects the two points (close neighbours in the AFM matrix) before and after the point A in the direction x and Vy is the vector that connects the two points (close neighbours in the AFM matrix) before and after the point A in the direction y. The vector Vn normal to the elementary surface in question is determined by the vector product of Vx and Vy. The angle of inclination a of the elementary surface is defined as the angle between the normal vector Vn of the elementary surface in question and the vector normal to the horizontal plane P.

A new matrix of points representing the inclination of each elementary surface at each point in the AFM matrix may be constructed. Starting from the matrix that indicates the inclination at each point of the surface, it is possible to produce a histogram of the angles from 0 to 90° (angular distribution) that gives the proportion of the surface which has an inclination lying within a certain angle interval (typically 2 degrees) (cf. FIG. 4). The angles are plotted on the x-axis. The proportion of elementary surfaces having an inclination to the horizontal plane equal to a given angle is plotted on the y-axis. A flat horizontal surface is defined as one where all the elementary surfaces have an inclination an angle of equal to 0°. In contrast, an extremely rough surface, with highly inclined elementary surfaces, shows an angular distribution with a high proportion of surface elementary surfaces having high angles of inclination.

In the present invention, to characterize the morphology of a surface, the value a in question is the angle $\alpha 50$ for which 50% of the elementary surfaces of the studied surface have an inclination equal to or less than this angle.

Preferably, the surface 2b facing said microcrystalline silicon elementary photoelectric device 6 comprises inclined elementary surfaces such that $\alpha 50$ is greater than 35°.

The radius of curvature p is the radius of curvature of the valley being formed between two elementary surfaces as shown on FIG. 2 of the surface 2b. Preferably, said radius of curvature is smaller than 25 nm.

Microcrystalline photoelectric device 6 comprises a p-type layer, optionally a i-type layer, and a n-type layer. The i-type and n-type layers comprise are well known from one skilled in the art.

Figure 5:
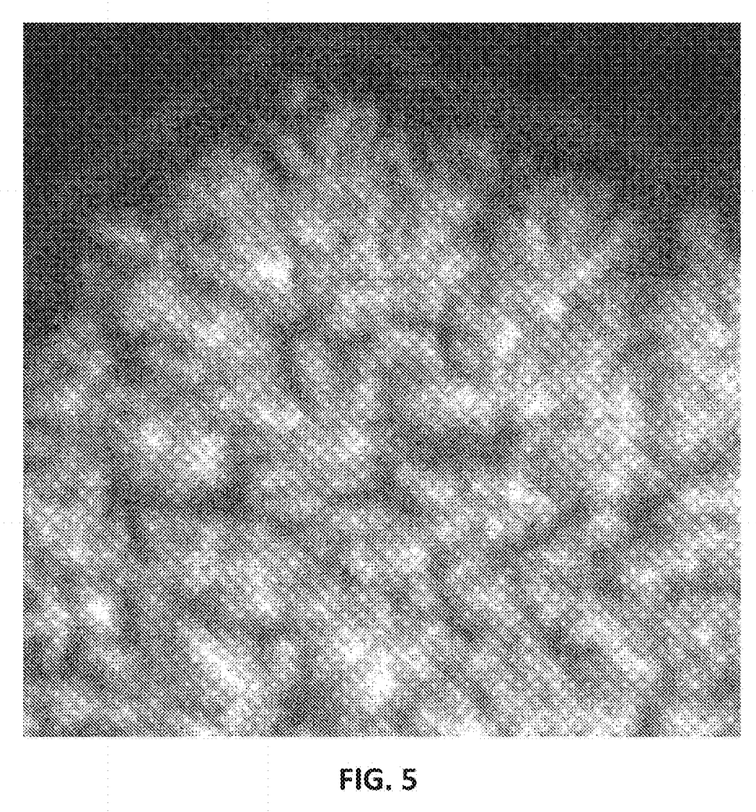
FIG. 5 is an EFTEM pane-view image of the $SiO_x$ layers used in the device of the invention showing presence on silicon grains (white) in the $SiO_x$ material.

Moreover, according to the invention, the p-type layer of microcrystalline photoelectric device 6, on the incoming light side, is made of at least one silicon alloy $SiM_x$ where M is O, C, N, and x>0.1, said p-type layer containing silicon grains in such a way that the layer remains sufficiently conductive. Such grains are shown by FIG. 5.

Said p-type layer has a planar resistivity comprised between $10^3$ and $10^8$ ohms-cm, preferably between $10^5$ and $10^6$ ohms-cm.

Preferably, the p-type layer of the microcrystalline silicon elementary photoelectric device 6 is made of a silicon alloy $SiM_x$ where M is O, C, N, or a mixture of O, C, N, and 0.1<x<1.

Preferably, the p-type layer of the microcrystalline silicon elementary photoelectric device 6 has a refractive index comprised between 2.5 and 3.5 at 600 nm.

Preferably, the p-type layer of the microcrystalline silicon elementary photoelectric device 6 has an average thickness comprised between 10 nm and 100 nm, preferably comprised between 10 nm and 60 nm, and more preferably between 15 nm and 30 nm.

Advantageously, the p-type layer of the microcrystalline silicon elementary photoelectric device 6 has a Raman silicon crystalline fraction greater than 10%.

In another not shown embodiment, the p-type layer of the microcrystalline silicon elementary photoelectric device can be, on the light incoming side, preceded by a stack consisting of a n-type microcrystalline layer, having a thickness comprised between 5 nm and 25 nm, a n-type $SiO_{x(0.5<x<2)}$ layer having a thickness comprised between 30 nm and 150 nm, and a n-type microcrystalline layer having a thickness comprised between 5 nm and 25 nm, said $SiO_x$ layer acting as an optical reflector.

The photoelectric devices 6 and 10 are deposited by processes known to those skilled in the art. Preferably, a PECVD (plasma-enhanced chemical vapour deposition) process is used.

Advantageously, the p-type layer of the microcrystalline silicon elementary photoelectric device is a $SiO_x$ layer made by PECVD, with a pressure comprised between 0.5 mbar and 15 mbar, an excitation frequency comprised between 13 MHz and 110 MHz, a total gas flow comprised between 0.1-5 sccm/cm² of substrate area, and gas flow ratios of 0.1-10 for $CO_2/SiH_4$ and of 0.0001-0.02 for $TMB/SiH_4$ or Diborane/$SiH_4$.

Preferably, the microcrystalline silicon elementary photoelectric device 6 further comprises a i-type microcrystalline silicon layer, which is deposited at a growth rate higher than 0.6 nm/s.

Figure 3:
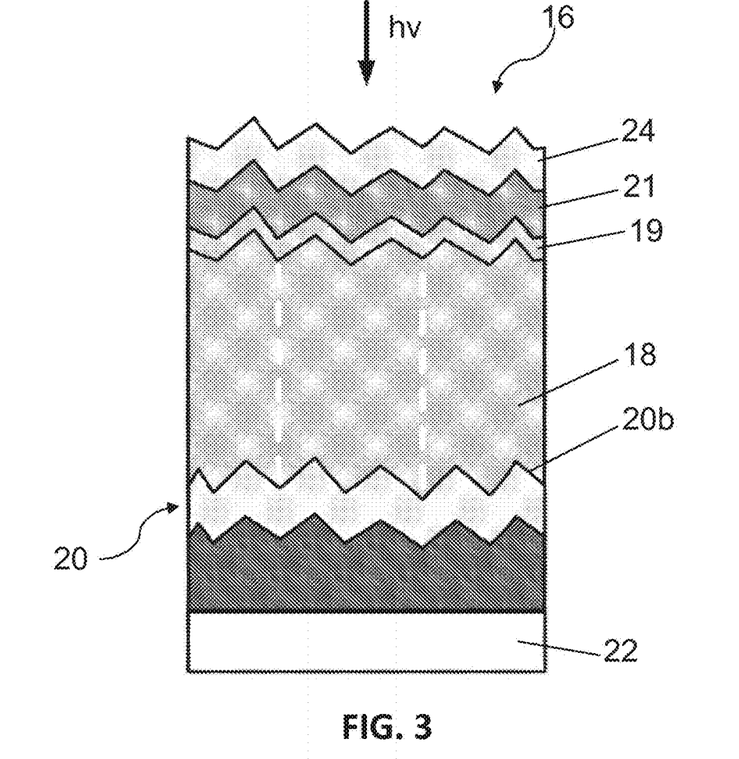
FIG. 3 is a schematic cross-section view of a a-Si:H/μc-Si:H double-junction solar cell in nip-nip configuration, according to the invention.

In another embodiment shown in FIG. 3, the double-junction solar cell 16 of the invention has a nip-nip configuration. It comprises in sequence a first conducting layer 20, corresponding to the back electrode layer, deposited on a substrate 22, a microcrystalline silicon elementary photoelectric device 18, an intermediate layer 19, an amorphous silicon elementary photoelectric device 21, and a second conducting layer 24, corresponding to the top electrode layer.

The back electrode layer is highly reflective. The top electrode layer 24 is a TCO layer.

The microcrystalline silicon photoelectric device 18 and the amorphous silicon elementary photoelectric device 21 have a nip configuration. Said microcrystalline silicon photoelectric device 18 comprises a n-type layer, optionally a i-type layer, and a p-type layer as defined above for the pin-pin configuration. The back electrode layer 20 comprises a top face 20b, which corresponds to the surface of the first conducting layer facing the microcrystalline silicon photoelectric device 18, which has the same morphology as defined above for the surface 2b of the pin-pin configuration.

The present description is based on a cell comprising two photoelectric devices. Of course, the cell according to the invention may comprise more than two photoelectric devices.

The present invention allows improved performance of thin film silicon solar cells grown onto textured substrates by developing a cell structure which permits to limit the impact of the local low-quality regions onto the solar cell electrical performance. The invention relates to the synergic combined use in a thin film silicon solar cell structure of a highly textured substrate to achieve good light trapping and of a p-type $SiO_x$ layer that reduces the influence of the cracks/bad diodes on the electrical characteristics of the solar cell. The proposed cell structure therefore permits to achieve high efficiencies by allowing for good light trapping without losing too much in electrical characteristics of the cell. The invention permits to achieve high efficiency cells without the need of a complex re-structuring of the textured interface, and without the need for very specific growth conditions to allow for reduced densities of local low-quality diodes. It therefore allows for a high improvement in the solar cell and module efficiency, yield and reproducibility. The thin p-type layer used in the invention, comprising for example microcrystalline $SiO_x$, as resistive p-layer, in conjunction with a very rough first conducting layer, is not an additional layer but an internal part of the p-i-n or n-i-p junction. It improves electrical characteristics of solar cell due to tailored out-of-plane resistance of p-layer while maintaining the electrical field throughout the device.

EXAMPLES

The following example illustrates the present invention without however limiting the scope.

As the essential features of the invention are linked to the microcrystalline silicon photoelectric device, some examples of the invention are made without any amorphous silicon photoelectric device.

Example 1

$SiO_x$ Layer for Better Cell Performance on Very Rough Substrates

Objectives

The goal of this experiment is to show that in the standard configuration the electrical characteristics of μc-Si cells are not improved with the use of a p-$SiO_x$ layer. Furthermore this experiment shows that the electrical characteristics of the μc-Si cell suffer heavily if a very rough substrate is used. It is shown that when a p-$SiO_x$ layer is used in combination with this very rough substrate, the electrical characteristics improve significantly. It is therefore possible with the present invention to make efficient solar cells on substrates that have been considered too rough before.

Experimental

The p-$SiO_x$ layers were deposited from a gas mixture of $SiH_4$, $H_2$, $B(CH_3)_3$ and $CO_2$ by very-high frequency plasma enhanced chemical vapor deposition (PECVD) at 110 MHz, 200° C., and with a power density of 0.1 W/cm$^2$. Layer characterization was performed on ~100 nm thick $SiO_x$ layers deposited on a glass substrate. (In the cells the p-layers will have a thickness of ~20nm.)

The optical gap $E_{04}$ was determined from fitting spectroscopic ellipsometry measurements to a Tauc-Lorentz dispersion model including a surface roughness layer. Two aluminum contacts were evaporated onto the samples, in order to measure the electrical in-plane dark conductivity (σ) after annealing in vacuum. The crystalline fraction of the silicon phase was measured by Raman spectroscopy. The same PECVD system was used to deposit 1.5 μm thick μc-Si cells. The p-μc-Si and p-μc-$SiO_x$ layers were deposited directly onto the front ZnO, without any grading or buffer layer. Low-pressure chemical vapor deposition (LP-CVD) ZnO was used as front and back electrode. Some of the front electrodes were exposed to surface treatment to render its morphology more adapted for the growth of the μc-Si cells. After an annealing at 180° C. during three hours, the current-voltage (I-V) curves of the cells were measured with a dual lamp WACOM solar simulator in standard test conditions (25° C., AM1.5g spectrum, 1000 W/m$^2$). The short current density ($J_{SC}$) was determined by integrating the product of the external quantum efficiency (EQE) and the incoming photon flux of the AM1.5g spectrum.

p$SiO_x$ Layer Characteristics

Figure 6A:
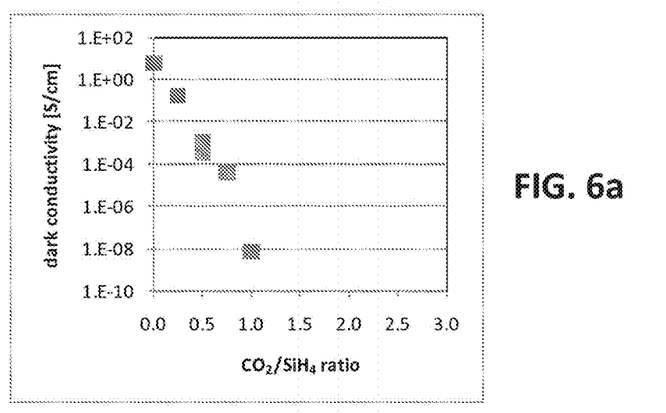
FIGS. 6a to 6c show respectively the dark conductivity, the optical gap $E_{04}$ and the percentage of Raman Si crystalline fraction for different $CO_2/SiH_4$ ratio used to obtain a p-SiO$_x$ layer.
Figure 6B:
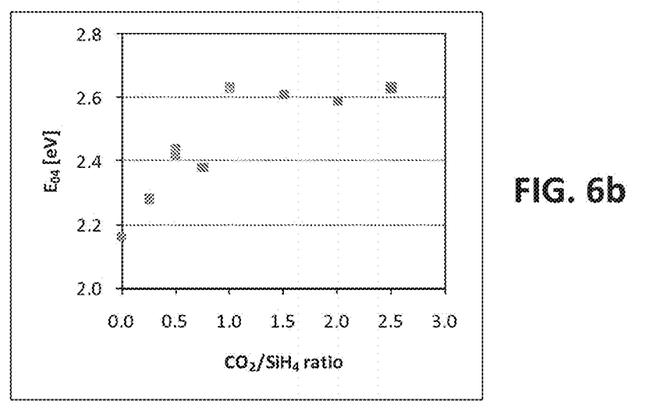
Figure 6C:
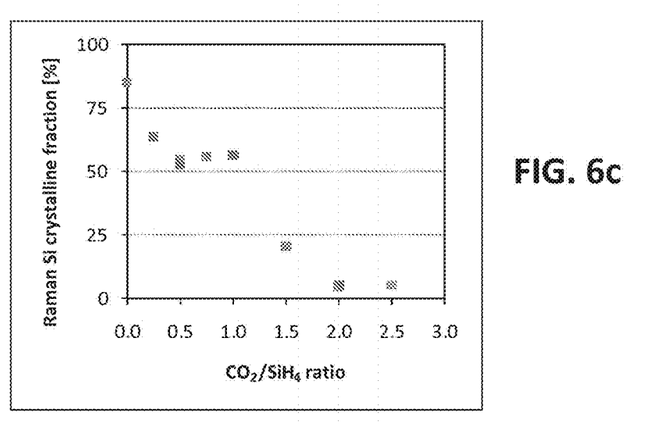

As shown in FIGS. 6a, 6b and 6c, the dark conductivity decreases with increasing $CO_2/SiH_4$ gas ratio, the optical gap ($E_{04}$) increases and the Raman crystalline fraction of the Si phase decreases. The p-$SiO_x$ layers used in the cells of the present invention are preferably obtained with a $CO_2/SiH_4$ gas ratio comprised between 0.5 and 0.7 and have an oxygen concentration of approximately 20 atomic %.

Comparison of Cell Characteristics with Standard μc-Si and μc-$SiO_x$ P-Layers as used in the Present Invention Two μc-Si cells were produced one after the other. A very rough LPCVD-ZnO layer and a smoothened LPCVD-ZnO layer were used as front electrodes for both cells.

Figure 4:
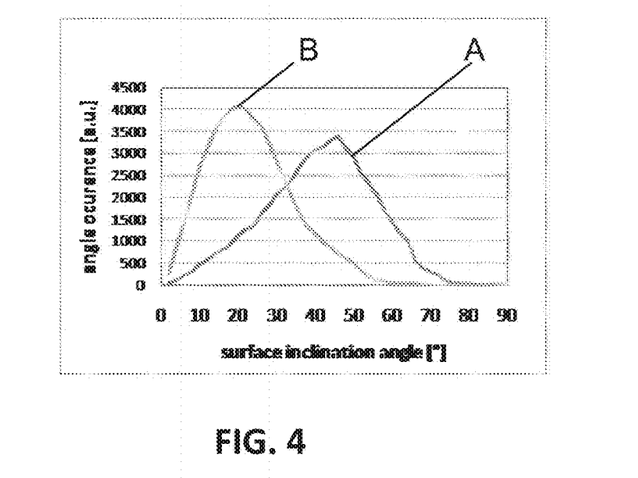
FIG. 4 shows the angle histograms of two different top electrodes layers used in the examples.

FIG. 4 shows the angle histogram of such very rough layer (curve A) and such smoothened layer (curve B).

For the very rough LPCVD-ZnO layer, the most represented angle in angle histogram was 46°. The rms-roughness was 150 nm and the lateral feature size (D) was 1 μm.

For the smoothened LPCVD-ZnO layer, the most represented angle in angle histogram was 20°. The rms-roughness was 90 nm and the lateral feature size (D) was 1 μm.

The only difference of the two cells is that one has a standard p-μc-Si layer and the other a p-μc-$SiO_x$ layer as defined above.

The results are given in Table below summarizing current-voltage (IV)-characteristics:

| p-layer used: | Smoothened substrate | | Very rough substrate | |
| --- | --- | --- | --- | --- |
| | $V_{oc}$ [mV] | Cell efficiency | $V_{oc}$ [mV] | Cell efficiency |
| μc-Si | 514 | 8.2 | 434 | 6.6% |
| μc-$SiO_x$ | 518 | 8.7 | 472 | 7.5% |
| Rel. | +0.8% | +7.0% | +8.8% | +18.2% |

Figure 7A:
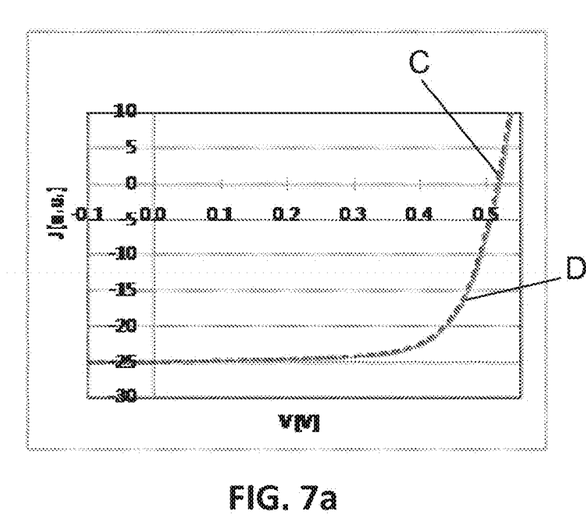
FIG. 7a shows the electrical cell characteristics obtained for a single-junction cell comprising a p-μc-Si layer and a cell comprising a p-μc-SiO$_x$ layer deposited on a smoothened top electrode layer.

In FIG. 7a, curve C (dotted line) corresponds to the cell comprising a p-μc-Si layer and curve D (continuous line) corresponds to the cell comprising a p-μc-$SiO_x$ layer. It can be seen from FIG. 7a that on the smoothened substrate the electrical cell characteristics are almost identical. For easier comparison of current-voltage curves, they have been normalized to Jsc=25mA/cm$^2$.

Figure 7B:
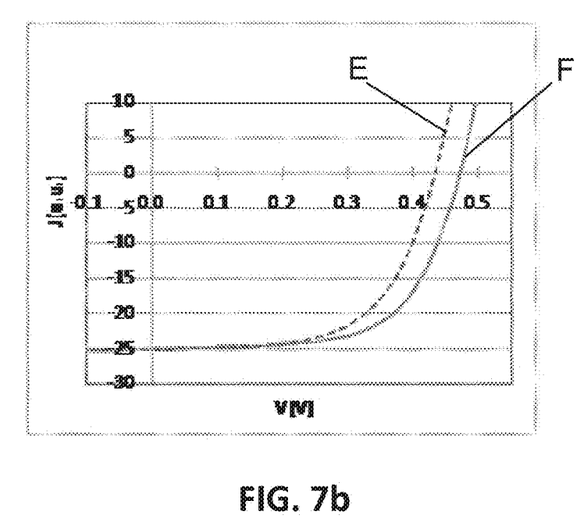
FIG. 7b shows the electrical cell characteristics obtained for a single junction microcrystalline cell comprising a p-μc-Si layer and a cell comprising a p-μc-SiO$_x$ layer deposited on a very rough top electrode layer with the same feature size (D) and similar Rrms as in FIG. 7a, but with highly inclined facets and valleys with short radius of curvature smaller than 100 nm.

In FIG. 7b, curve E corresponds to the cell comprising a p-μc-Si layer and curve F corresponds to the cell comprising a p-μc-$SiO_x$ layer. It can be seen from FIG. 7b, that if a very rough front electrode is used, the cell characteristics are, surprisingly, significantly increased with the use of the p-$SiO_x$ layer because the influence of the bad regions is reduced with the p-$SiO_x$ layer.

Example 2

$SiO_x$ Layer for Better Cell Performance on Very Rough Substrates with a Large Variety of Different i-Layers Objectives The goal of this experiment is to show that the incorporation of the p-layer $SiO_x$ layer improves robustness of the μc-Si:H cell design, as it leads to high efficiency for different process conditions, while it is shown that these deposition regimes variations have a strong impact on standard cells efficiencies. The present invention therefore allows to cope with less restrained deposition parameters windows, clearly improving yield, uniformity and overall performance for large area modules.

Experimental

The p-$SiO_x$ layers were deposited from a gas mixture of $SiH_4$, $H_2$, $B(CH_3)_3$ and $CO_2$ by very-high frequency plasma enhanced chemical vapor deposition (PECVD) at 40 MHz, 180° C., and with a power density of 0.1 W/cm$^2$. The same PECVD system was used to deposit 1.5 μm thick μc-Si cells. The p-μc-Si and p-μc-$SiO_x$ layers were deposited directly onto the front ZnO, without any grading or buffer layer.

Low-pressure chemical vapor deposition (LP-CVD) ZnO was used as front and back electrode. The current-voltage (I-V) curves of the cells were measured with a dual lamp WACOM solar simulator in standard test conditions (25° C., AM1.5g spectrum, 1000 W/m$^2$). The short current density ($J_{SC}$) was determined by integrating the product of the external quantum efficiency (EQE) and the incoming photon flux of the AM1.5g spectrum. All cells in this study were developed onto similar rough LPCVD ZnO front contact.

Figure 8:
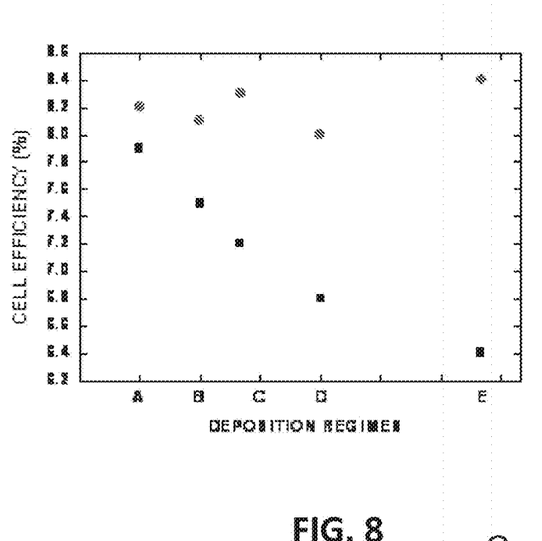
FIG. 8 shows the cell efficiencies of single-junction microcrystalline cells on very rough top electrode layers as a function of the deposition regimes for cells comprising a p-μc-Si layer and for cells comprising a p-μc-SiO$_x$ layer.

Comparison of Cell Characteristics with Standard µc-Si and µc-SiO$_x$ p-Layers as used in the Present Invention In this experiment, 5 different deposition regimes were used for the intrinsic layer of µc-Si:H single cells. All regimes were developed so as to have a similar growth rate (1 nm/s) and similar crystalline fractions of the i-layers, while the hydrogen over silane flux ratio was decreased by going from regime E to regime A. These process variations allow for an improved efficiency of the µc-Si cells with standard p-layers when going from regime E to regime A, with conversion efficiencies rising from 6.4% to 7.9%. This study therefore shows up to 20% relative efficiency variations from one process to another. In parallel, 5 other solar cells were developed using the same deposition regimes but incorporating the p-SiO$_x$ layer. The results are shown by FIG. 8, in which the rounds dots correspond to the cells comprising a p-µc-SiO$_x$ layer and the square dots correspond to the cells comprising a p-µc-Si layer. Here, all cells demonstrate high efficiencies from 8.1% to 8.4%, which therefore correspond to a relative efficiency improvement of 4% to 30% when compared to the cells using standard p-layers. The cell efficiency variation between the different processes is here strongly reduced, as a relative variation of only 3.5% is demonstrated.

For a given rough substrate, the density of cracks and their influence on the cell characteristics can therefore be influenced by changing the deposition condition of the i-layer. However, while this can assure improved conversion efficiency, it can lead to i-layer deposition regimes not preferable for industrial process due to other constraints such as layer homogeneity over large areas, deposition rate, powder formation, substrate heating, layer characteristics and cell efficiency dependence on tight process parameters windows, etc . . . . Here the use of the p-SiO$_x$ layer over a large variety of different i-layers quality is shown to allow for high efficiency for all cells developed, therefore demonstrating that the invention leads to an important increase of robustness of the cell design versus deposition regime and i-layer quality variations.

Example 3 p-SiO$_x$ Layer in Micromorph Cell

In a first case, two identical micromorph cells deposited on a textured substrate were produced, with the only difference that the standard p-µc-Si layer of the microcrystalline bottom cell is replaced with a p-µc-SiO$_x$ layer as defined above. The current-voltage curves are measured.

Figure 9:
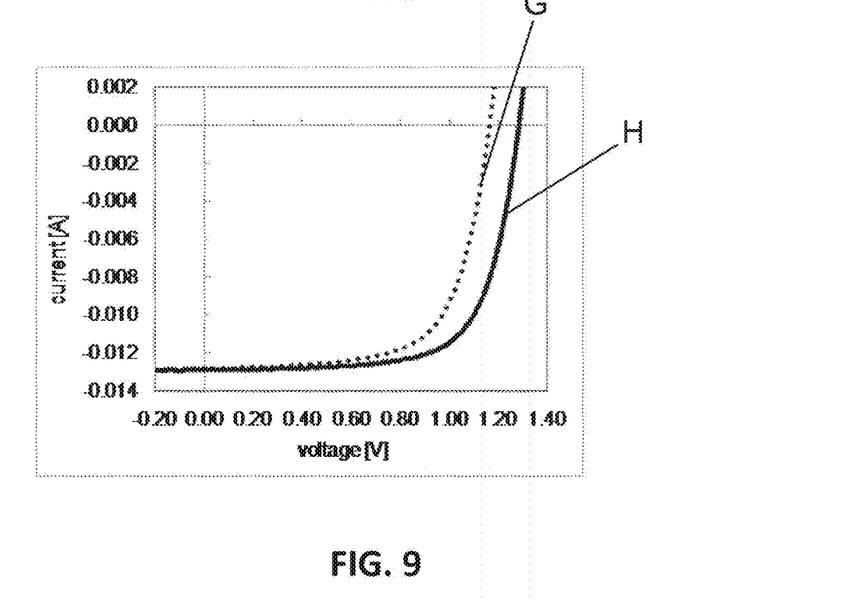
FIG. 9 represents the current as a function of the voltage for a micromorph cell (α-Si:H/μc-Si:H tandem cell) deposited on a very rough top electrode layer comprising a bottom cell with a p-μc-Si layer and for a micromorph cell comprising a bottom cell with a p-μc-SiO$_x$ layer.

The results are shown by FIG. 9, in which curve G corresponds to the micromorph cell comprising a bottom cell with a standard p-µc-Si layer, and curve H corresponds to the micromorph cell comprising a bottom cell with the p-µc-SiO$_x$ layer. FIG. 9 shows that the Voc is increased from 1.16V to 1.28V and the Fill Factor is increased from 67.2% to 69.8%.

Figure 10:
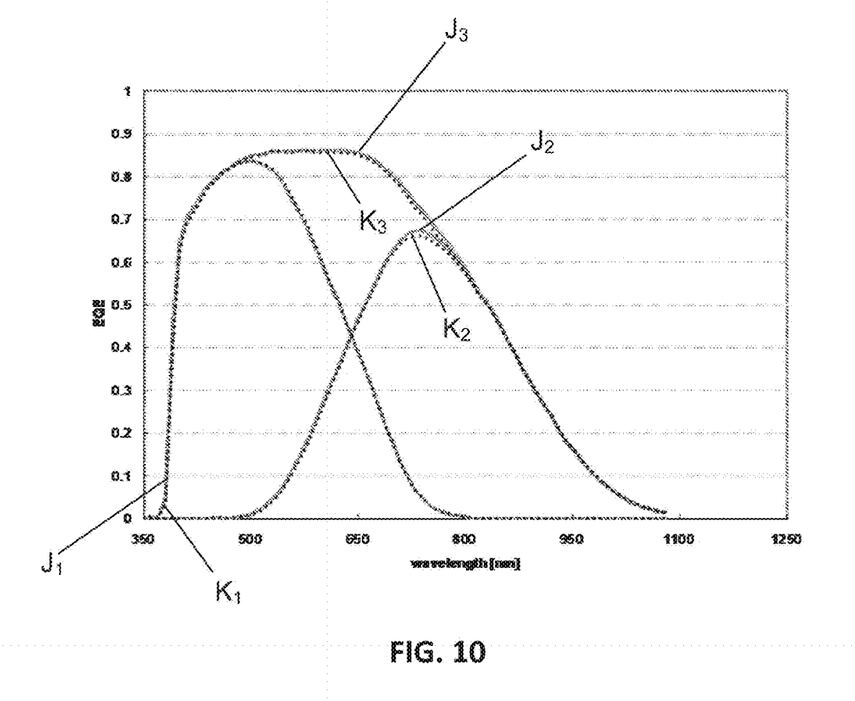
FIG. 10 represents the external quantum efficiency (EQE) as a function of wavelength for the same cells as in FIG. 9.

The external quantum efficiencies of the two cells are shown in FIG. 10 in which:
curves J1, J2 and J3 (continuous lines) show the external quantum efficiency respectively of the top cell (Jsc–top=12.41 mA/cm$^2$), of the bottom cell (Jsc–bot=12.15 mA/cm$^2$), and the sum of the two sub-cells (Jsc–tot=Jsc–top+Jsc–bot=24.56 mA/cm$^2$) for the micromorph cell comprising a bottom cell with the p-µc-SiO$_x$ layer; and
curves K1, K2 and K3 (dotted lines) show the external quantum efficiency respectively of the top cell (Jsc–top=12.42 mA/cm$^2$), of the bottom cell (Jsc–bot=11.97 mA/cm$^2$), and the sum of the two sub-cells (Jsc–tot=Jsc–top+Jsc–bot=24.39 mA/cm$^2$) for the micromorph cell comprising a bottom cell with the standard p-µc-Si layer.

From the external quantum efficiency, as shown in FIG. 10, it can be seen that the p-SiO$_x$ layer does not change the currents in the sub-cells and has a negligible optical effect.

In a second case, two series of micromorph cells on LPCVD ZnO rough front contact with increasing plasma treatment were produced. In the first series all micromorph cells have a standard p-µc-Si layer in the microcrystalline bottom cell while in the second series all micromorph cells have a p-µc-SiO$_x$ layer in the microcrystalline bottom cell, as defined above. The current-voltage curves and the efficiencies are measured.

Figure 11:
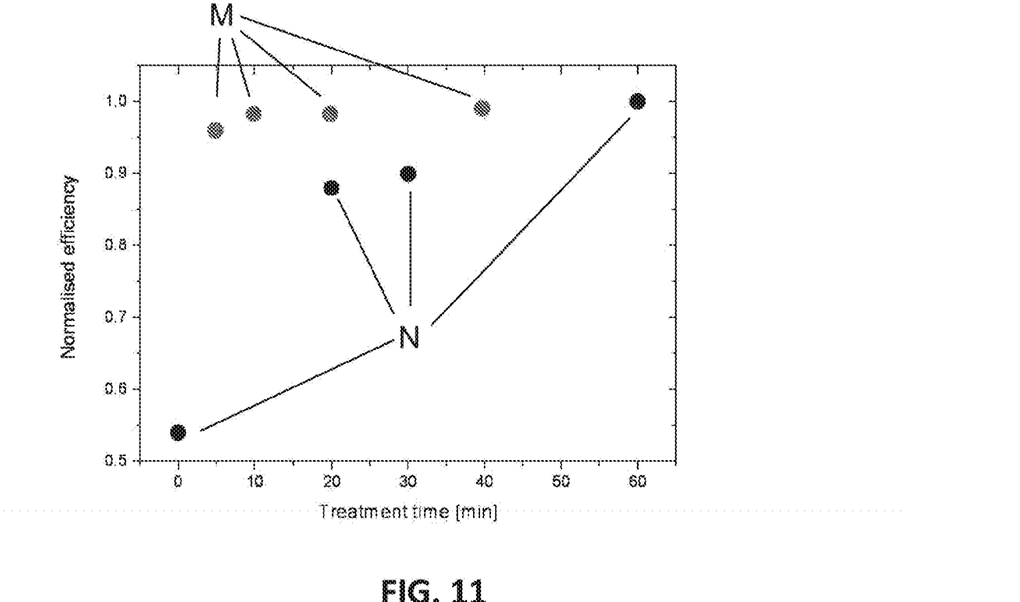
FIG. 11 represents the normalized efficiency as a function of the treatment time for micromorph solar cells deposited on highly textured LPCVD ZnO front contacts with different plasma treatments.
Figure 12:
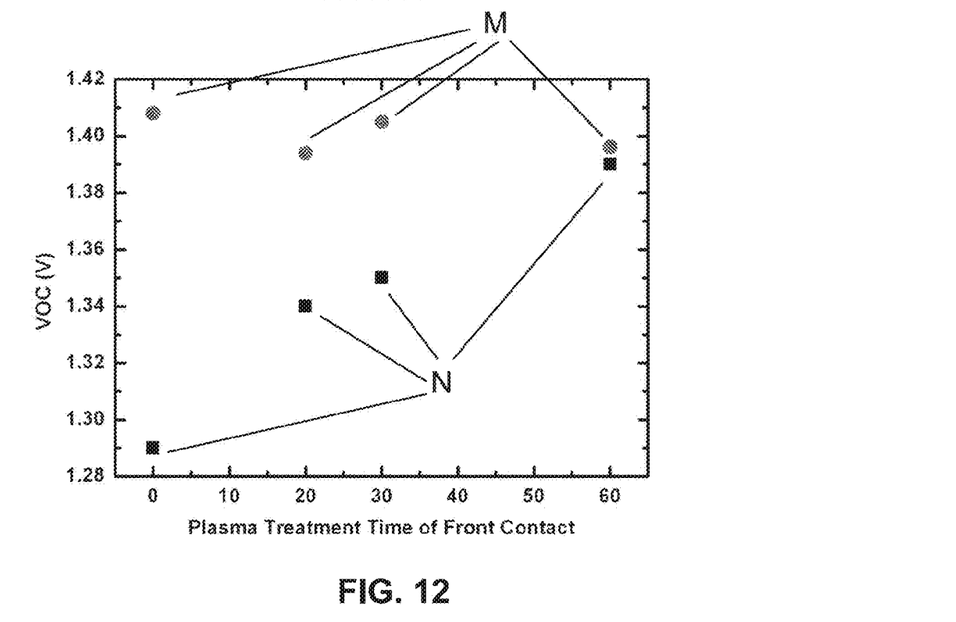
FIG. 12 represents the Open Circuit Voltage (VOC) as a function of the plasma treatment time of front contact for micromorph solar cells deposited on highly textured LPCVD ZnO front contacts with different plasma treatments.

The results of efficiencies and of open-circuit voltage are shown in FIGS. 11 and 12. FIG. 11 shows that cells incorporating a p-µc-SiO$_x$ layer (points M) in the microcrystalline bottom cell exhibit improved efficiencies when compared to cells making use of standard p-µc-Si layers (points N). FIG. 12 shows that cells incorporating a p-µc-SiO$_x$ layer in the microcrystalline bottom cell (points M) have stable and high VOC for all cells while cells integrating standard p-µc-Si layers (points N) have a strong drop of VOC for the most textured substrates.

While efficiencies are improved for long plasma treatment in the case of micromorph cells with a standard p-µc-Si layer in the bottom cell, stable efficiencies for the different roughnesses are demonstrated for the micromorph cells integrating a p-µc-SiO$_x$ layer in the microcrystalline bottom cell.

The micromorph cell efficiency improvement is principally realized by maintaining high VOC cells even on highly textured substrates thanks to the p-µc-SiO$_x$ layer in the microcrystalline bottom cell.

The invention claimed is:
1. A multiple-junction photoelectric device comprising, in sequence, a substrate, a first conducting layer, at least two elementary photoelectric devices, at least one of said elementary photoelectric devices being made of microcrystalline silicon, and a second conducting layer, wherein:
the first conducting layer has a surface facing said microcrystalline silicon elementary photoelectric device such that:
said surface has a lateral feature size bigger than 100 nm, and smaller than 1500 nm and a root-means-square roughness bigger than 40 nm, and smaller than 500 nm,
said surface comprises inclined elementary surfaces such that $\alpha_{50}$ is greater than 20°, where $\alpha_{50}$ is the angle for which 50% of the elementary surfaces of the surface of the first conducting layer have an inclination equal to or less than this angle, and
said surface comprises valleys being formed between two elementary surfaces and having a radius of curvature smaller than 100 nm,
and wherein said microcrystalline silicon elementary photoelectric device comprises, on the incoming light side, a p-type layer being made of at least one silicon alloy SiM$_x$ where M is O, C, N, and x>0.1, said p-type layer containing silicon grains.

2. The multiple-junction photoelectric device according to claim 1, wherein said surface facing said microcrystalline silicon elementary photoelectric device comprises inclined elementary surfaces such that $\alpha_{50}$ is greater than 35°.

3. The multiple-junction photoelectric device according to claim 1, wherein said surface facing said microcrystalline silicon elementary photoelectric device comprises valleys having a radius of curvature smaller than 25 nm.

4. The multiple-junction photoelectric device according to claim 1, wherein the p-type layer of the microcrystalline silicon elementary photoelectric device is made of a silicon alloy $SiM_x$ where M is O, C, N, or a mixture of O, C, N, and $0.1<x<1$.

5. The multiple-junction photoelectric device according to claim 1, wherein the p-type layer of the microcrystalline silicon elementary photoelectric device has a refractive index comprised between 2.5 and 3.5 at 600 nm.

6. The multiple-junction photoelectric device according to claim 1, wherein the p-type layer of the microcrystalline silicon elementary photoelectric device has an average thickness comprised between 10 nm and 100 nm.

7. The multiple-junction photoelectric device according to claim 1, wherein the p-type layer of the microcrystalline silicon elementary photoelectric device has a Raman silicon crystalline fraction greater than 10%.

8. The multiple-junction photoelectric device according to claim 1, wherein the first conducting layer is a back electrode layer deposited on the substrate, the microcrystalline silicon elementary photoelectric device being deposited on the first conducting layer and having a n-i-p configuration, and the second conducting layer is a top electrode layer.

9. The multiple-junction photoelectric device according to claim 8, wherein the other elementary photoelectric device deposited between the microcrystalline silicon elementary photoelectric device and the top electrode layer is based on amorphous silicon and has a n-i-p configuration.

10. The multiple-junction photoelectric device according to claim 1, wherein the substrate is transparent, the first conducting layer is a top electrode layer being deposited on said substrate, the second conducting layer is a back electrode layer, and the microcrystalline silicon elementary photoelectric device has a p-i-n configuration.

11. The multiple-junction photoelectric device according to claim 10, wherein the other elementary photoelectric device is deposited between the first conductive layer and the microcrystalline silicon elementary photoelectric device, and is based on amorphous silicon with a p-i-n configuration.

12. The multiple-junction device according to claim 11, wherein the p-type layer of the microcrystalline silicon elementary photoelectric device is, on the light incoming side, preceded by a stack consisting of a n-type microcrystalline layer, having a thickness comprised between 5 nm and 25 nm, a n-type $SiO_{x(0.5<x<2)}$ layer having a thickness comprised between 30 nm and 150 nm, and a n-type microcrystalline layer having a thickness comprised between 5 nm and 25 nm, said $SiO_x$ layer acting as an optical reflector.

13. The multiple-junction photoelectric device according to claim 1, wherein said surface has a lateral feature size bigger than 200 nm, and smaller than 1500 nm and a root-means-square roughness bigger than 60 nm, and smaller than 500 nm.

14. The multiple-junction photoelectric device according to claim 1, wherein said surface has a lateral feature size bigger than 200 nm, and smaller than 1500 nm and a root-means-square roughness bigger than 100 nm, and smaller than 500 nm.

15. The multiple-junction photoelectric device according to claim 1, wherein the p-type layer of the microcrystalline silicon elementary photoelectric device has an average thickness comprised between 10 nm and 60 nm.

16. The multiple-junction photoelectric device according to claim 1, wherein the p-type layer of the microcrystalline silicon elementary photoelectric device has an average thickness comprised between 15 nm and 30 nm.

17. A method for producing a multiple-junction photoelectric device as defined in claim 1, wherein it comprises the following steps of:
   providing a substrate on which a first conducting layer has been deposited, the first conducting layer having, opposite to the substrate, a surface such that:
      said surface has a lateral feature size bigger than 100 nm, and smaller than 1500 nm and a root-means-square roughness bigger than 40 nm, and smaller than 500 nm,
      said surface comprises inclined elementary surfaces such that $\alpha_{50}$ is greater than 20°, where $\alpha_{50}$ is the angle for which 50% of the elementary surfaces of the surface of the first conducting layer have an inclination equal to or less than this angle, and
      said surface comprises valleys being formed between two elementary surfaces and having a radius of curvature smaller than 100 nm,
   depositing at least two elementary photoelectric devices, at least one of said elementary photoelectric devices being made of microcrystalline silicon, said microcrystalline silicon elementary photoelectric device comprising, on the incoming light side, a p-type layer being made of at least one silicon alloy $SiM_x$ where M is O, C, N, and $x>0.1$, said p-type layer containing silicon grains, and
   depositing a second conducting layer.

18. The method according to claim 17, wherein the other elementary photoelectric device is based on amorphous silicon.

19. The method according to claim 17, wherein the p-type layer of the microcrystalline silicon elementary photoelectric device is a $SiO_x$ layer made by PECVD, with a pressure comprised between 0.5 and 15 mbar, an excitation frequency comprised between 13 MHz and 110 MHz, a total gas flow comprised between 0.1-5 sccm/cm² of substrate area, and gas flow ratios of 0.1-10 for $CO_2/SiH_4$ and of 0.0001-0.02 for $TMB/SiH_4$ or Diborane/$SiH_4$.

20. The method according to claim 17, wherein the microcrystalline silicon elementary photoelectric device further comprises a i-type microcrystalline silicon layer, which is deposited at a growth rate higher than 0.6 nm/s.

* * * * *